United States Patent
Yosui

(10) Patent No.: US 9,742,051 B2
(45) Date of Patent: Aug. 22, 2017

(54) HIGH-FREQUENCY SIGNAL TRANSMISSION LINE AND MANUFACTURING METHOD THEREOF

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 85 days.

(21) Appl. No.: 15/006,377

(22) Filed: Jan. 26, 2016

(65) Prior Publication Data

US 2016/0141739 A1  May 19, 2016

Related U.S. Application Data

(63) Continuation of application No. PCT/JP2015/052283, filed on Jan. 28, 2015.

(30) Foreign Application Priority Data

Feb. 7, 2014  (JP) ................. 2014-021868

(51) Int. Cl.

| H01P 3/02 | (2006.01) |
|---|---|
| H01P 11/00 | (2006.01) |
| H05K 1/02 | (2006.01) |
| H01P 3/08 | (2006.01) |
| H01F 17/06 | (2006.01) |

(52) U.S. Cl.
CPC .............. *H01P 3/02* (2013.01); *H01P 11/003* (2013.01); *H05K 1/024* (2013.01); *H01F 2017/065* (2013.01); *H05K 2201/0129* (2013.01); *H05K 2201/0209* (2013.01); *H05K 2201/086* (2013.01); *H05K 2201/09672* (2013.01)

(58) Field of Classification Search
CPC ....... H05K 2201/09236; H05K 1/0219; H05K 1/0298; H01P 3/08
USPC .......................................... 333/1, 5, 34, 238
See application file for complete search history.

(56) References Cited

FOREIGN PATENT DOCUMENTS

| JP | 2-91903 A | 3/1990 |
|---|---|---|
| JP | 6-111634 A | 4/1994 |
| JP | 2003-257739 A | 9/2003 |
| JP | 2014-192185 A | 10/2014 |

OTHER PUBLICATIONS

Official Communication issued in International Application PCT/JP2015/052283, mailed on Apr. 7, 2015.

*Primary Examiner* — Dean Takaoka
(74) *Attorney, Agent, or Firm* — Keating & Bennett, LLP

(57) ABSTRACT

A high-frequency signal transmission line includes a body including a plurality of first base layers and a second base layer stacked on one another in a stacking direction. The first base layers have a first relative permeability, and the second base layer has a relative permeability lower than the first relative permeability. A first signal line and a second signal line extending along the first signal line are provided in the body. In a cross section perpendicular or substantially perpendicular to a first direction in which the first signal line extends, the second base layer occupies at least a portion of an area between the first signal line and the second signal line. In the cross section perpendicular or substantially perpendicular to the first direction, the plurality of first base layers define a loop enclosing the first signal line, the second signal line and the second base layer.

16 Claims, 17 Drawing Sheets

FIG. 2
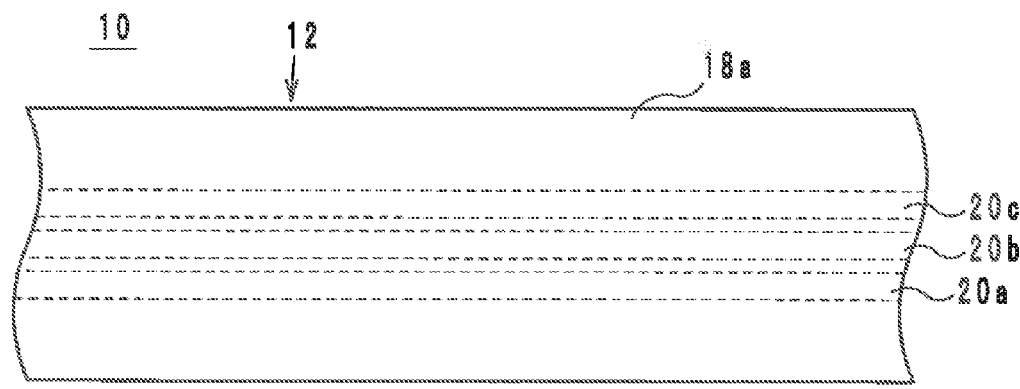
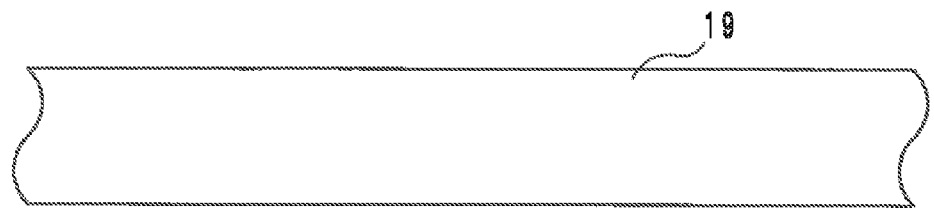
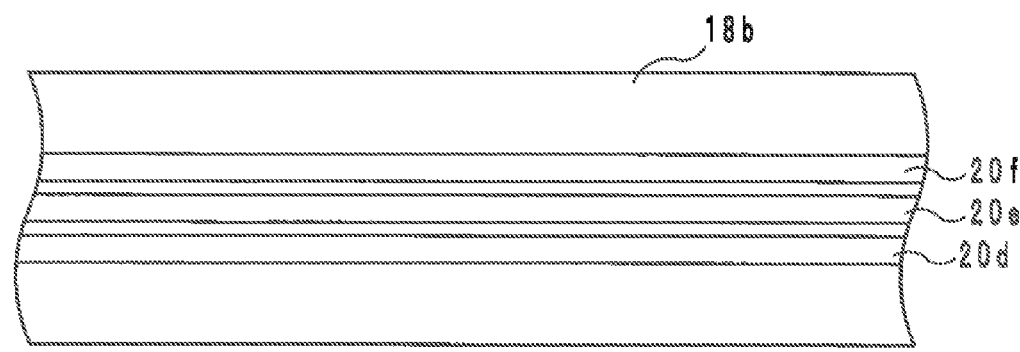
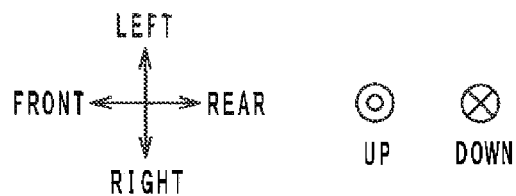

FIG. 3A
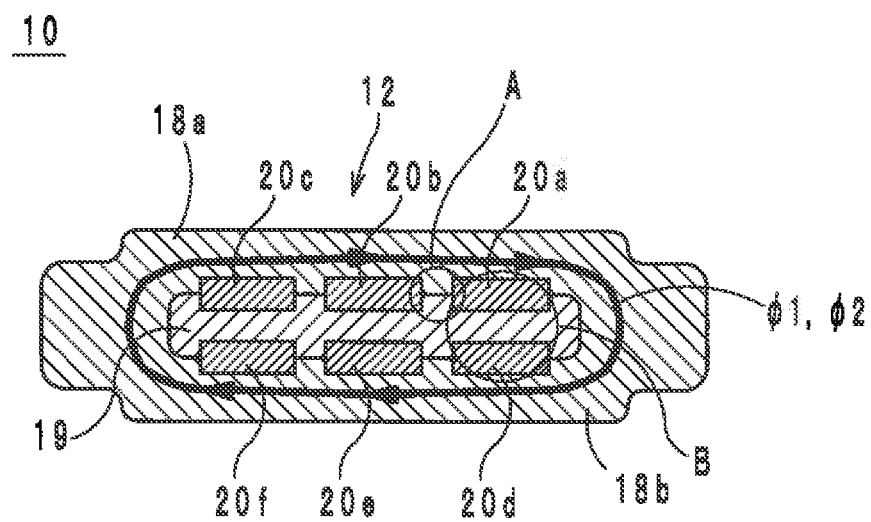
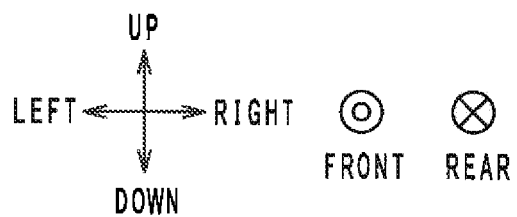

FIG. 5
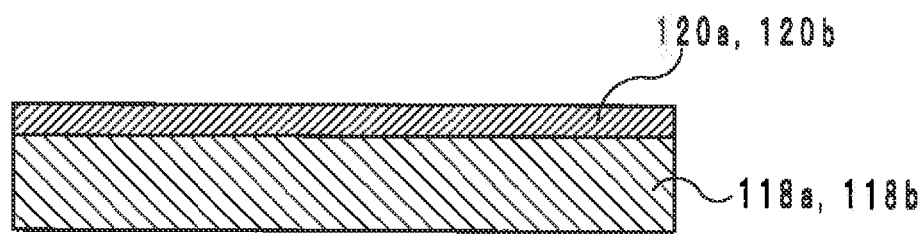
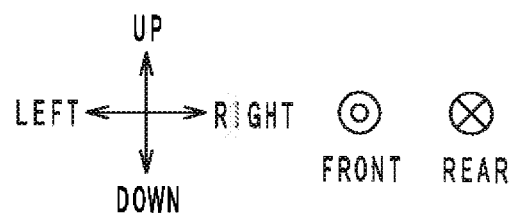
FIG. 6
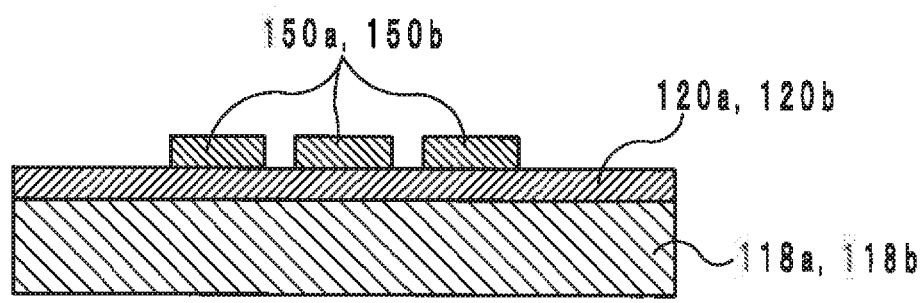
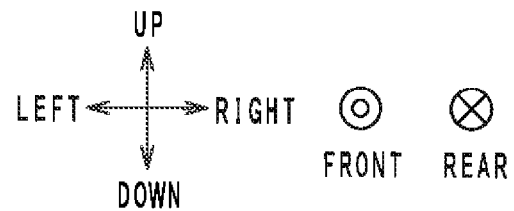

F I G . 7
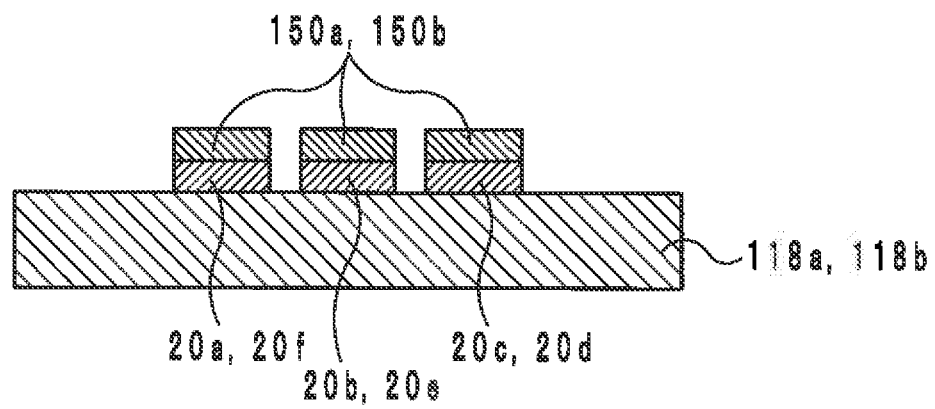
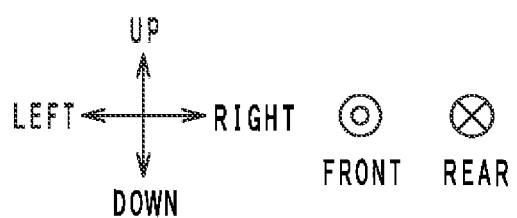

FIG. 8
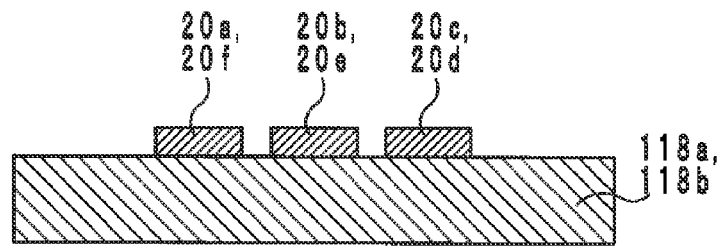
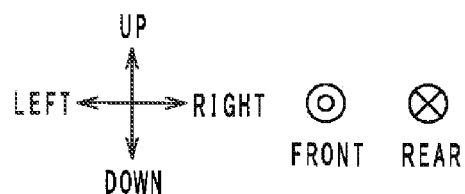
FIG. 9
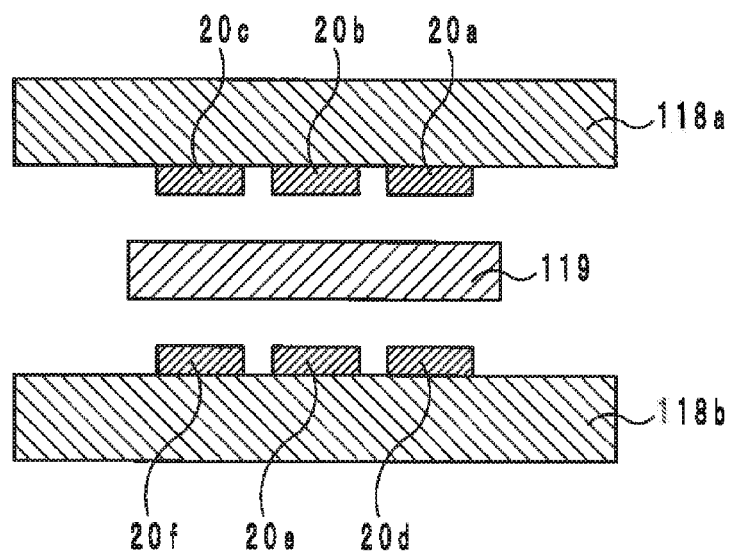
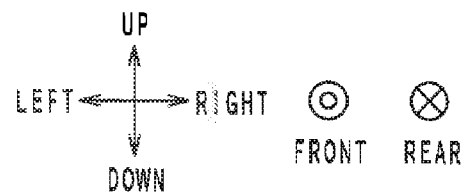

FIG. 10A
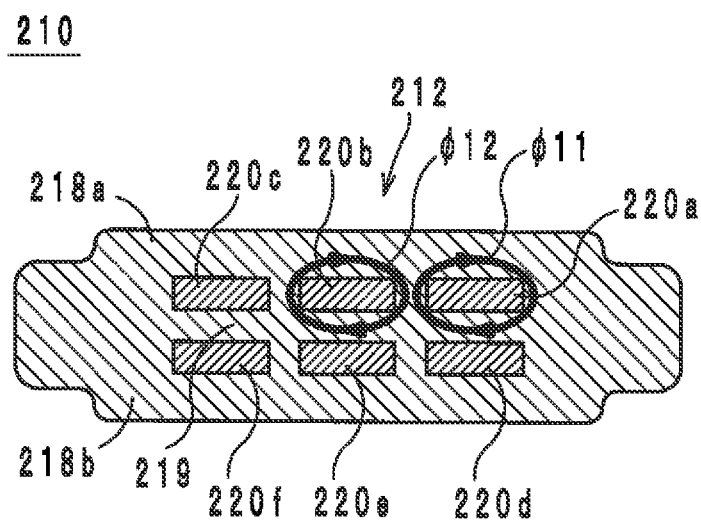
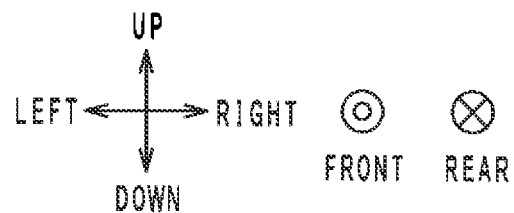

FIG. 10B
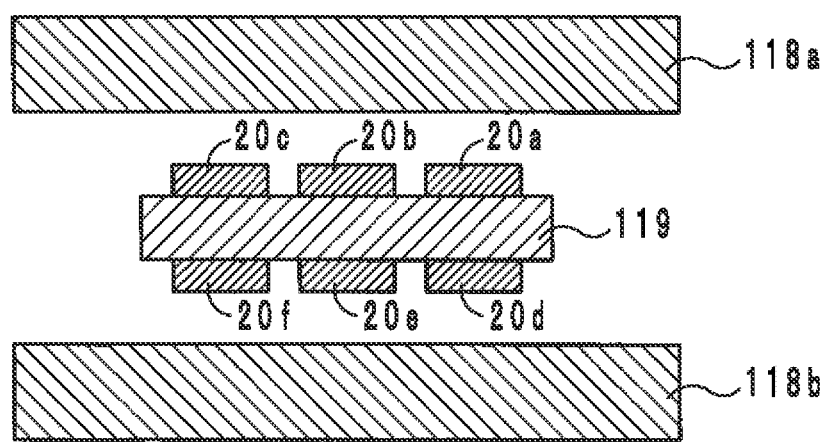
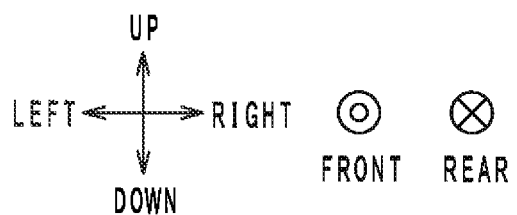

F I G. 1 1 A
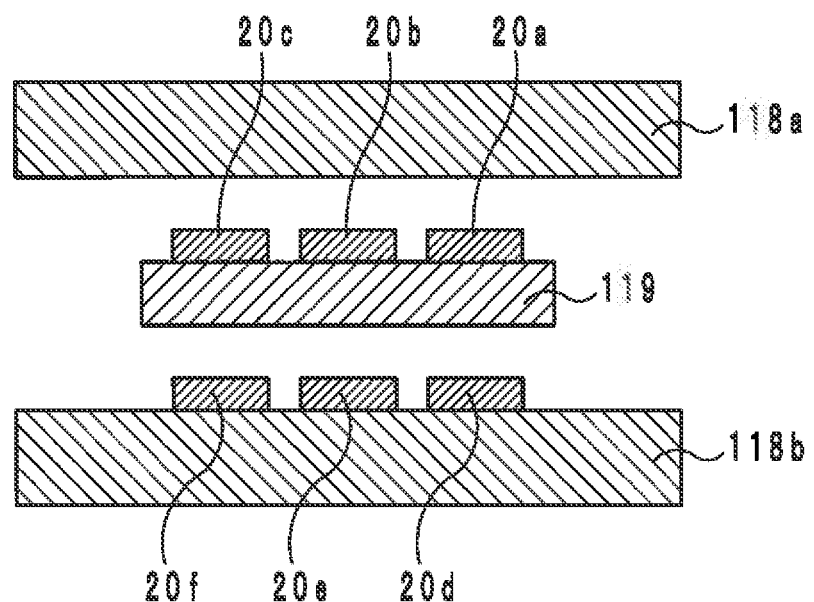
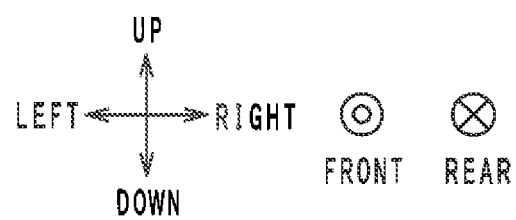

FIG. 11B
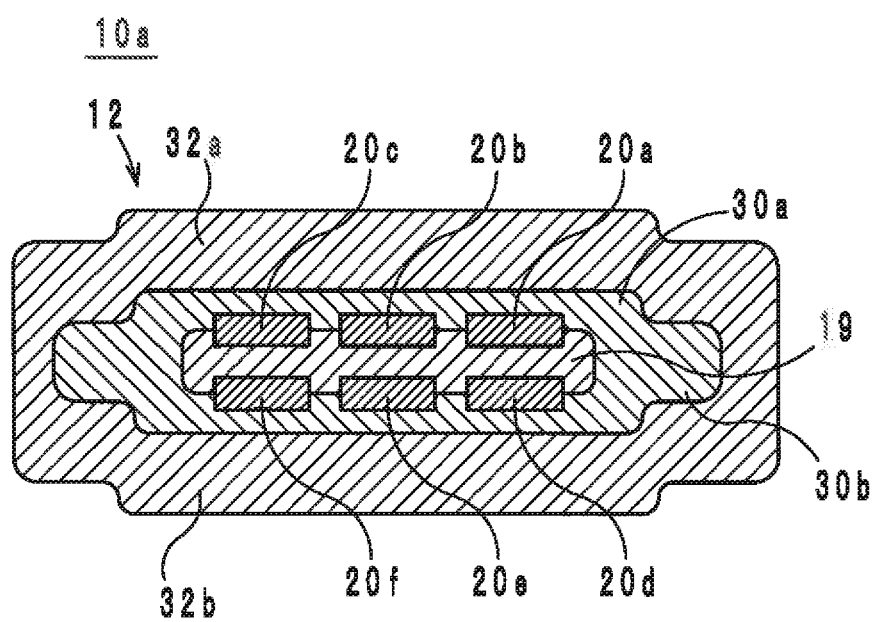
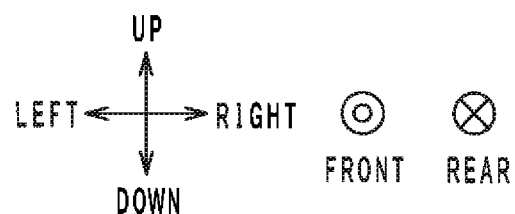

F I G . 1 1 C
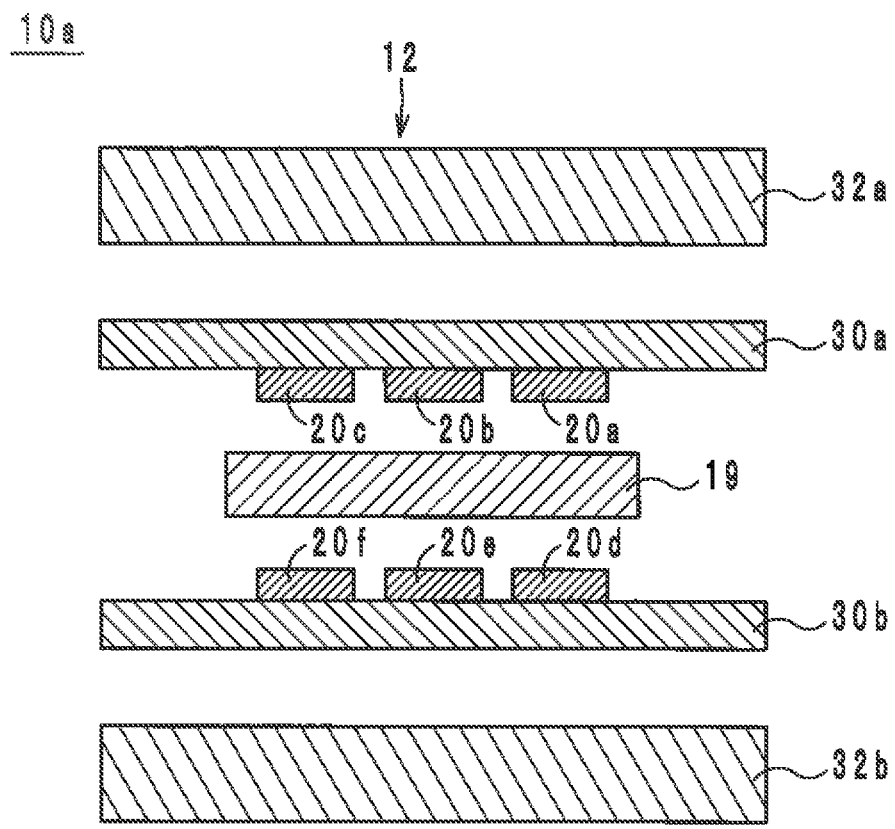

FIG. 12
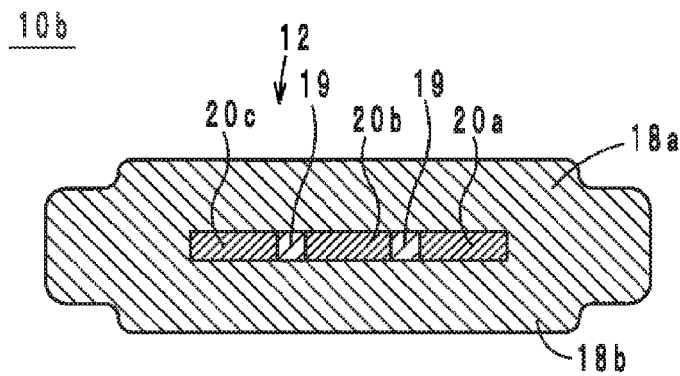
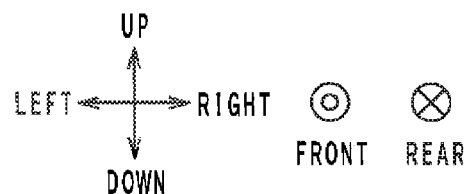
FIG. 13
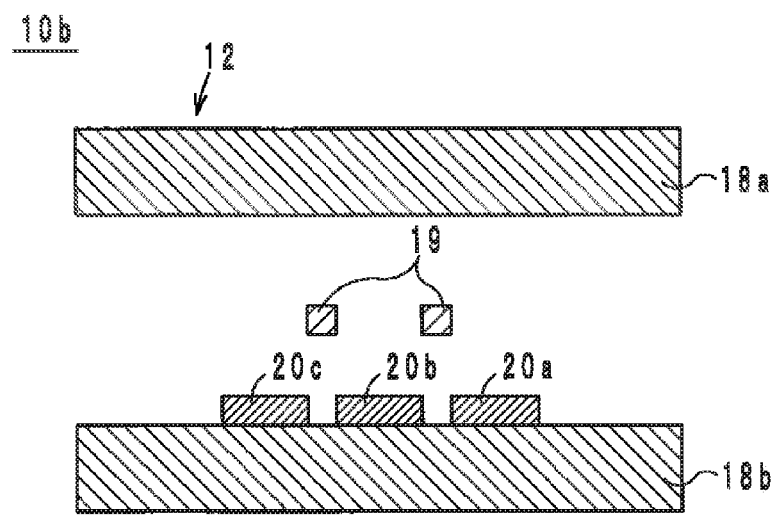
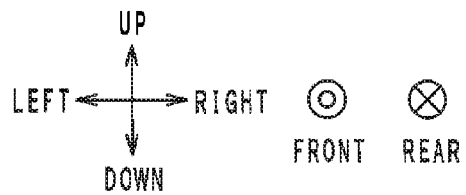

FIG. 16
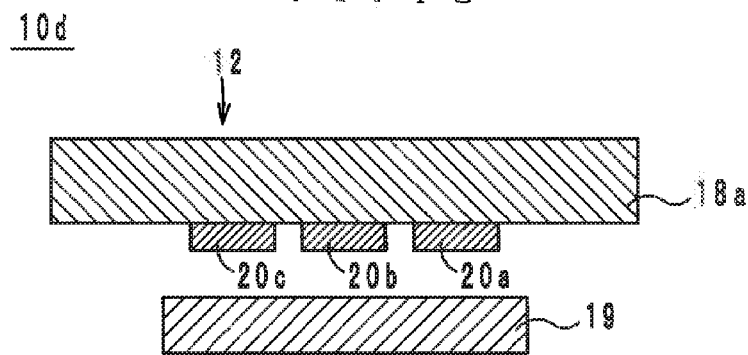
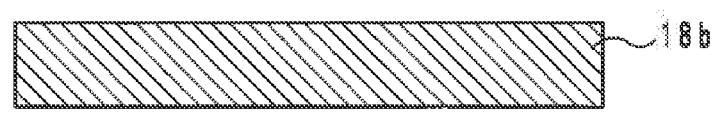
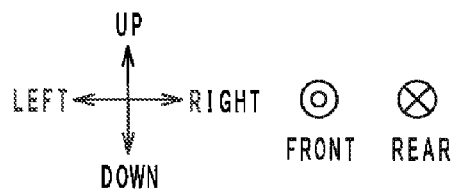
FIG. 17
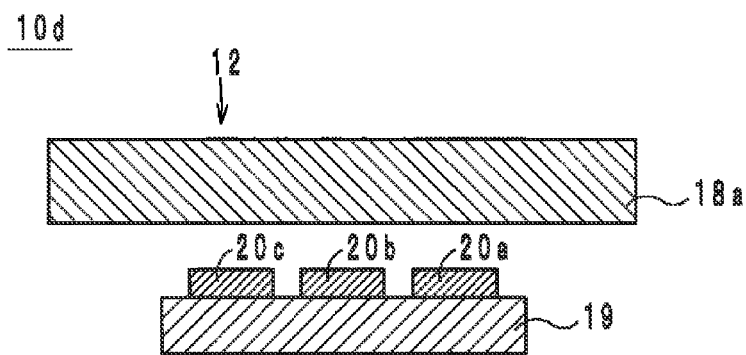
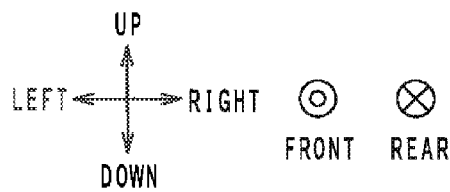

FIG. 20
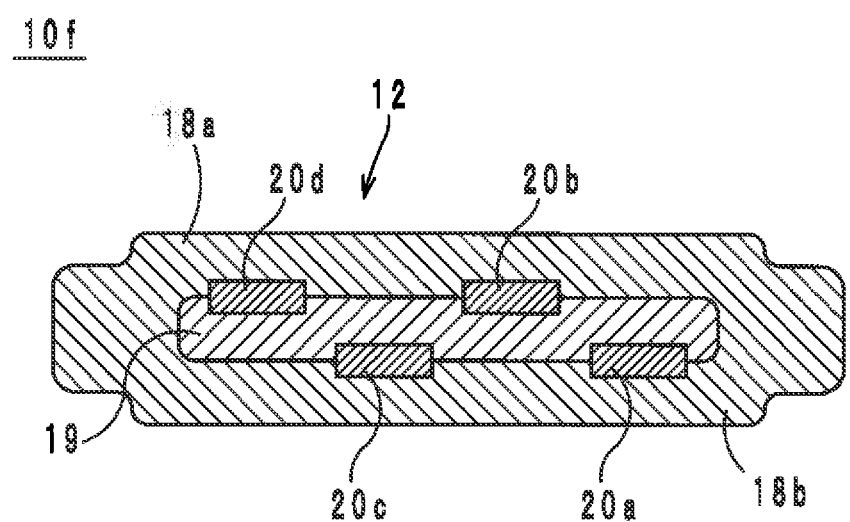
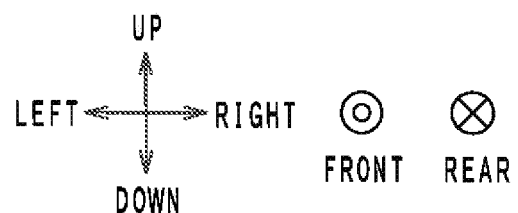

HIGH-FREQUENCY SIGNAL TRANSMISSION LINE AND MANUFACTURING METHOD THEREOF

BACKGROUND OF THE INVENTION

1. Field of the Invention

The present invention relates to a high-frequency signal transmission line and a manufacturing method thereof, and more particularly to a high-frequency signal transmission line including a plurality of signal lines and a manufacturing method thereof.

2. Description of the Related Art

As an example of past inventions relating to high-frequency signal transmission lines, a mounted ferrite core disclosed in Japanese Patent Laid-Open Publication No. H2-91903 is known. The ferrite core includes a cylindrical core body and a base having a screw hole. A flat cable encasing a power wire, a ground line, a signal line, etc., passes through inside the ferrite core body. The ferrite core is fitted to the chassis of an electronic device or the like via a screw inserted in the screw hole. In this ferrite core, common mode noise flowing on the power wire, the ground line and the signal line can be eliminated.

The ferrite core disclosed in Japanese Patent Laid-Open Publication No. H2-91903 is attached to a flat cable so as to enclose the flat cable. Accordingly, a large space is needed for the ferrite core, which makes it difficult to use the ferrite core in an electronic device.

SUMMARY OF THE INVENTION

Preferred embodiments of the present invention provide a high-frequency signal transmission line that eliminates common mode noise and has a reduced size.

According to a preferred embodiment of the present invention, a high-frequency signal transmission line includes a body including a plurality of first base layers and a second base layer stacked in a stacking direction, the plurality of first base layers having a first relative permeability, the second base layer having a second relative permeability lower than the first relative permeability; a first signal line provided at the body; and a second signal line provided at the body and extending along the first signal line, wherein in a cross section perpendicular or substantially perpendicular to a first direction in which the first signal line extends, the second base layer occupies at least a portion of an area between the first signal line and the second signal line; and in the cross section perpendicular or substantially perpendicular to the first direction, the plurality of first base layers define a loop enclosing the first signal line, the second signal line and the second base layer.

According to a preferred embodiment of the present invention, a method for manufacturing a high-frequency signal transmission line includes a first base layer preparing step of preparing a plurality of first base layers having a first relative permeability; a second base layer preparing step of preparing a second base layer made of a material containing thermoplastic resin and having a second relative permeability lower than the first relative permeability; a signal line preparing step of preparing a first signal line and a second signal line extending along the first signal line; a stacking step of stacking the first base layers and the second base layer while placing the second base layer in an area between the first signal line and the second signal line or in contact with the area between the first signal line and the second signal line in a cross section perpendicular or substantially perpendicular to an extending direction of the first signal line such that the first signal line, the second signal line and the second layer are sandwiched between the first base layers; and a pressure bonding step of heating and pressing the stacked first and second base layers.

According to various preferred embodiments of the present invention, it is possible to reduce the size of a high-frequency signal transmission line that eliminates common mode noise.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is an exploded view of the high-frequency signal transmission line 10.

FIG. 3A is a sectional view of the high-frequency signal transmission line 10 cut along the line X-X.

FIG. 5 is a sectional view illustrating a step of the manufacturing method of the high-frequency signal transmission line 10.

FIG. 6 is a sectional view illustrating a step of the manufacturing method of the high-frequency signal transmission line 10.

FIG. 7 is a sectional view illustrating a step of the manufacturing method of the high-frequency signal transmission line 10.

FIG. 8 is a sectional view illustrating a step of the manufacturing method of the high-frequency signal transmission line 10.

FIG. 9 a sectional view illustrating a step of the manufacturing method of the high-frequency signal transmission line 10.

FIG. 10A is a sectional view of a high-frequency signal transmission line 210 according to a comparative example.

FIG. 10B is a sectional view illustrating a step of a manufacturing method according to a first modification for manufacturing the high-frequency signal transmission line 10.

FIG. 11A is a sectional view illustrating a step of a manufacturing method according to a second modification for manufacturing the high-frequency signal transmission line 10.

FIG. 11B is a sectional view of a high-frequency signal transmission line 10a.

FIG. 11C is an exploded view of the high-frequency signal transmission line 10a.

FIG. 12 is a sectional view of a high-frequency signal transmission line 10b.

FIG. 13 is an exploded view of the high-frequency signal transmission line 10b.

FIG. 16 is an exploded view of the high-frequency signal transmission line 10d indicating a first example of a manufacturing method.

FIG. 17 is an exploded view of the high-frequency signal transmission line 10d indicating a second example of a manufacturing method.

FIG. 20 is a sectional view of a high-frequency signal transmission line 10f.

DETAILED DESCRIPTION OF THE PREFERRED EMBODIMENTS

High-frequency signal transmission lines according to various preferred embodiments of the present invention and non-limiting examples of manufacturing methods thereof will hereinafter be described.

Figure 1:
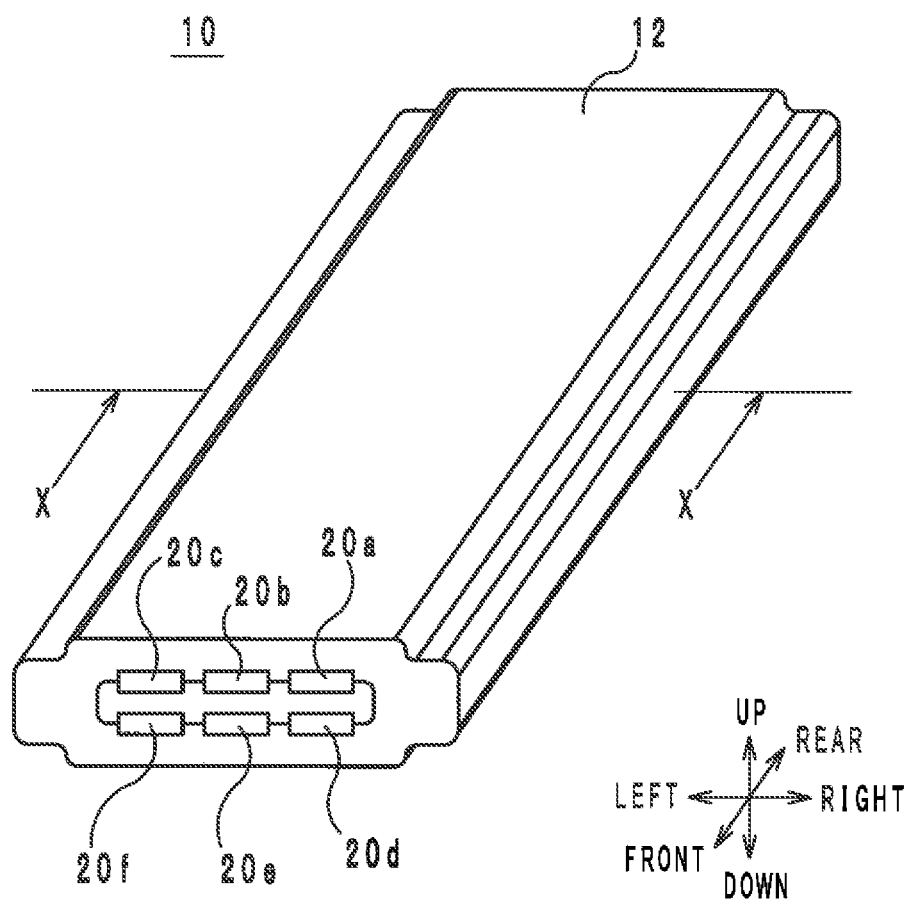
FIG. 1 is a perspective view of a high-frequency signal transmission line 10.
Figure 3B:
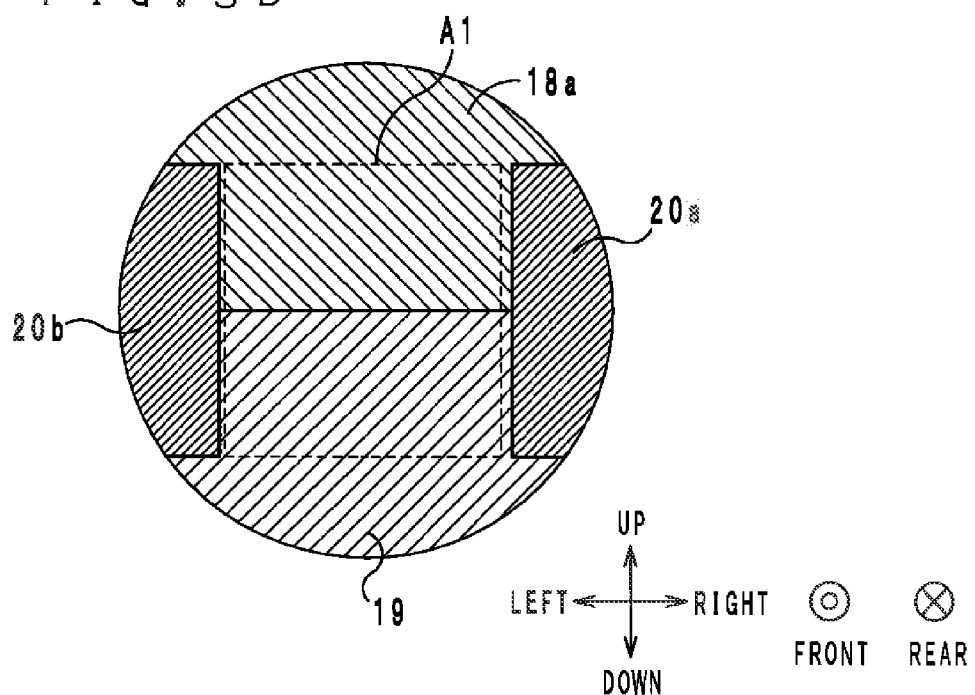
FIG. 3B is an enlarged view of a portion A in FIG. 3A.
Figure 4:
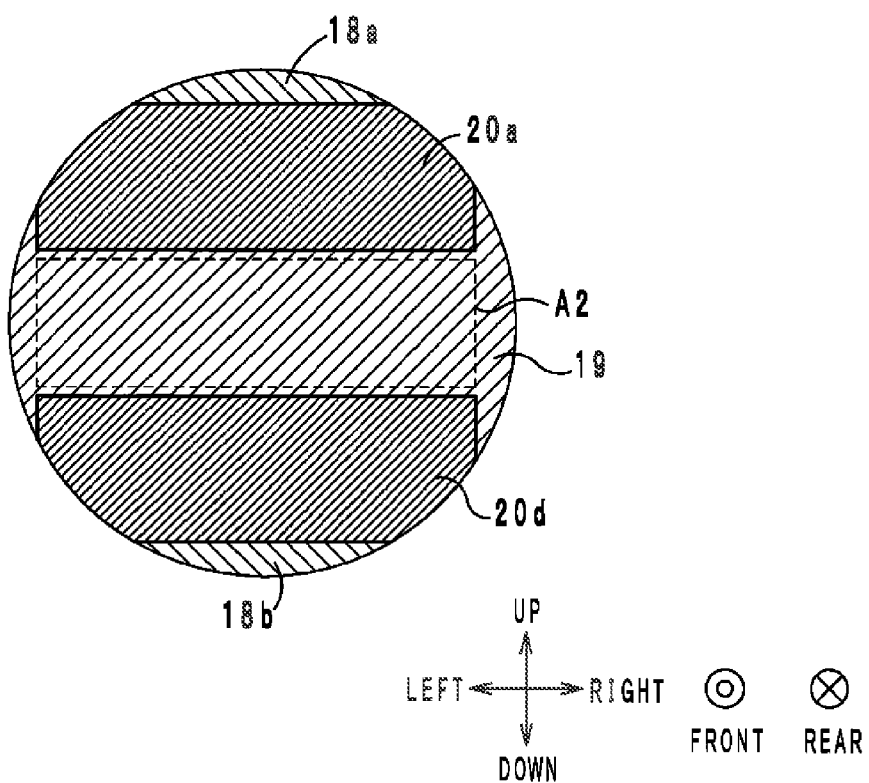
FIG. 4 is an enlarged view of a portion B in FIG. 3A.

First, the structure of the high-frequency signal transmission line is described with reference to the drawings. FIG. 1 is a perspective view of the high-frequency signal transmission line 10. FIG. 2 is an exploded view of the high-frequency signal transmission line 10. FIG. 3A is a sectional view of the high-frequency signal transmission line 10 cut along the line X-X. FIG. 3B is an enlarged view of a portion A in FIG. 3A. FIG. 4 is an enlarged view of a portion B in FIG. 3A.

In the following, a layer stacking direction of a body 12 will be referred to as an up-down direction. A direction in which the body 12 extends when viewed from above will be referred to as a front-rear direction. A direction perpendicular or substantially perpendicular to the up-down direction and the front-rear direction will be referred to as a right-left direction. The up-down direction, the right-left direction and the front-rear direction are perpendicular or substantially perpendicular to one another. The up-down direction, the right-left direction and the front-rear direction do not need to conform to the directions when the high-frequency signal transmission line 10 is actually used. In the following, the dimension of the body 12 in the front-rear direction will be referred to as a length. The dimension of the body 12 in the right-left direction will be referred to as a width. The dimension of the body 12 in the up-down direction will be referred to as a thickness.

The high-frequency signal transmission line 10 is a flat cable to connect two circuit boards electrically, and the high-frequency signal transmission line 10 is used, for example, in a cell phone or any other electronic device. As illustrated in FIGS. 1, 2 and 3A, the high-frequency signal transmission line 10 includes a body 12 and signal lines 20a-20f.

The body 12 is a main body of the high-frequency signal transmission line 10. When viewed from above, the body 12 is strip-shaped and extends in the front-rear direction. The body 12 does not need to be straight but may be curved. Since the high-frequency signal transmission line 10 is a flat cable, the width of the body 12 is considerably greater than the thickness thereof.

As seen in FIGS. 2 and 3A, the body 12 is a multilayer body including base layers 18a, 19 and 18b stacked in this order from the upper side to the lower side. Thus, the base layer 19 is sandwiched between the base layers 18a and 18b in the up-down direction. The body 12 is flexible. In the following, the upper surface of the body 12 will be referred to as a top surface, and the lower surface of the body 12 will be referred to as a bottom surface.

As seen in FIG. 2, when viewed from above, the base layers 18a and 18b are strip-shaped and extend in the front-rear direction. When viewed from above, the base layers 18a and 18b have the same shape as the body 12. The base layers 18a and 18b are made of a material obtained by mixing thermoplastic resin with a magnetic powder, and the base layers 18a and 18b have a relatively high relative permeability µ1. In this preferred embodiment, the base layers 18a and 18b are made of a material obtained by mixing liquid crystal polymer with an alloy-based powder, such as ferrite, permalloy or the like.

As seen in FIG. 2, when viewed from above, the base layer 19 is strip-shaped and extends in the front-rear direction. The width of the base layer 19 is smaller than the widths of the base layers 18a and 18b. The base layers 18a, 19 and 18b are stacked on one another such that the center of the base layer 19 with respect to the right-left direction is substantially at the same position as the centers of the base layers 18a and 18b with respect to the right-left direction. Therefore, when the base layers 18a, 19 and 18b are stacked on one another, the base layers 18a and 18b protrude from the base layer 19 rightward and leftward. The right protruding portion of the base layer 18a and the right protruding portion of the base layer 18b are joined together. The left protruding portion of the base layer 18a and the left protruding portion of the base layer 18b are joined together.

The base layer 19 is made of thermoplastic resin mixed with no magnetic powder, and the base layer 19 has a relatively low relative permeability µ2. Specifically, the relative permeability µ2 is lower than the relative permeability µ1. In this preferred embodiment, the base layer 19 preferably is made of liquid crystal polymer, and therefore, the relative permeability µ2 of the base layer 19 is close to 1. It is preferred that the thermoplastic resin contained in the material for the base layers 18a and 18b is substantially same as the thermoplastic resin contained in the material for the base layer 19. In the following, the upper surface of each of the base layers 18a, 18b and 19 will be referred to as an obverse surface, and the lower surface of each of the base layers 18a, 18b and 19 will be referred to as a reverse surface.

The signal lines 20a-20f are provided in the body 12 and extend in the front-rear direction. The signal lines 20a-20f are made of a conductive material having a relatively low resistance value, such as Cu or the like. The signal lines 20a-20c are provided on the reverse surface of the base layer 18a and are arranged in this order from right to left at uniform intervals. When viewed from above, the signal lines 20a-20c overlap the base layer 19. Thus, the signal lines 20a-20c are located between the base layer 18a and the base layer 19 and contact with the base layer 18a and the base layer 19.

In a cross section of the high-frequency signal transmission line 10 cut perpendicular or substantially perpendicularly to the front-rear direction, the base layer 19 occupies a portion of the area between the signal lines 20a and 20b and a portion of the area between the signal lines 20b and 20c. As an example, the area A1 between the signal lines 20a and 20b will be described below with reference to FIG. 3B.

In manufacturing the high-frequency signal transmission line 10, the body 12 is heated and pressed from above and underneath. Since the base layers 18a and 19 are made of thermoplastic resin, the base layers 18a and 19 soften by heat. The softening base layer 18a comes into the area A1 between the signal lines 20a and 20b from the upper side. Meanwhile, the softening base layer 19 comes into the area A1 between the signal lines 20a and 20b from the lower side. As a result, the base layer 18a occupies the upper portion of the area A1, and the base layer 19 occupies the lower portion of the area A1. In the area A1, the base layer 19 contacts with the signal line 20a and the signal line 20b. The area between the signal lines 20b and 20c is in the same situation as the area A1, and a description thereof is omitted.

As seen in FIG. 2, the signal lines 20d-20f are provided on the obverse surface of the base layer 18b and are arranged in this order from right to left at uniform intervals. When viewed from above, the signal lines 20d-20f overlap the base layer 19. Thus, the signal lines 20d-20f are located between the base layer 19 and the base layer 18b and contact with the base layer 18b and the base layer 19. Also, when viewed from above, the signal lines 20d-20f overlap the signal lines 20a-20c respectively. Thus, the signal lines 20a and 20d are arranged in the up-down direction. The signal lines 20b and 20e are arranged in the up-down direction. The signal lines 20c and 20f are arranged in the up-down direction.

In the cross section perpendicular or substantially perpendicular to the front-rear direction, the base layer 19 occupies a portion of the area between the signal lines 20d and 20e and a portion of the area between the signal lines 20e and 20f. The base layer 19 occupies the respective upper portions of these areas, and the base layer 18b occupies the respective lower portions of these areas. The area between the signal lines 20d and 20e and the area between the signal lines 20e and 20f are in the same situation as the area A1 except that the layers are upside down, and descriptions thereof are omitted.

In the cross section perpendicular or substantially perpendicular to the front-rear direction, the base layer 19 occupies the area between the signal lines 20a and 20d, the area between the signal lines 20b and 20e and the area between signal lines 20c and 20f. As an example, the area A2 between the signal lines 20a and 20d will be described below with reference to FIG. 4.

When viewed from above, the signal line 20a overlaps the signal line 20d. The signal line 20a is located between the base layer 18a and the base layer 19, and the signal line 20d is located between the base layer 19 and the base layer 18b. Accordingly, as seen in FIG. 4, the base layer 19 occupies the area A2 between the signal lines 20a and 20d. In the area A2, neither the base layer 18a nor the base layer 18b lies. The area between the signal lines 20b and 20e and the area between the signal lines 20c and 20f are in the same situation as the area A2, and descriptions thereof are omitted.

In the high-frequency signal transmission line 10 having the structure above, in the cross section perpendicular or substantially perpendicular to the front-rear direction, as seen in FIG. 3A, the base layers 18a and 18b define a loop enclosing the signal lines 20a-20f and the base layer 19.

Next, a non-limiting example of a manufacturing method of the high-frequency signal transmission line 10 will hereinafter be described with reference to the drawings. FIGS. 5-9 are sectional views illustrating steps of the manufacturing method. In FIGS. 5-8, a sheet 118a is illustrated upside down. Therefore, in FIG. 5-8, the upper side of the sheet 118a is the reverse surface thereof, and the lower side of the sheet 118a is the obverse surface thereof.

First, sheets 118a and 118b to be used as the base layers 18a and 18b are prepared. The sheets 118a and 118b are made of a material obtained by mixing liquid crystal polymer with a magnetic powder. The sheet 118a is a large-size sheet including a plurality of base layers 18a arranged in a matrix, and the sheet 118b is a large-size sheet including a plurality of base layers 18b arranged in a matrix.

Next, a sheet 119 to be used as the base layer 19 is prepared. The sheet 19 is made of liquid crystal polymer. The sheet 119 is a large-size sheet including a plurality of base layers 19 arranged in a matrix. Since the width of the base layer 19 is smaller than the widths of the base layers 18a and 18b, a space is formed between two adjacent base layers 19 on the sheet 119. Therefore, the sheet 119 is preliminarily cut.

Next, as illustrated in FIG. 5, metal films 120a and 120b are formed on the entire reverse surface of the sheet 118a and on the entire obverse surface of the sheet 118b, respectively. Specifically, copper foils are applied to the reverse surface of the sheet 118a and on the obverse surface of the sheet 118b, respectively. The surfaces of the copper foils on the sheets 118a and 118b are, for example, galvanized for corrosion proofing and smoothened. In this way, metal films 120a and 120b are formed. The thicknesses of the metal films 120a and 120b preferably are within a range, for example, from about 10 μm to about 20 μm.

Next, as illustrated in FIG. 6, resists 150a having the same shapes as the signal lines 20a-20c respectively are printed on the metal film 120a. In a similar way, resists 150b having the same shapes as the signal lines 20d-20f respectively are printed on the metal film 120b.

Next, as illustrated in FIG. 7, the metal films 120a and 120b are etched, and thus, the portions of the metal films 120a and 120b which are not covered by the resists 150a and 105b are removed. Thereafter, as illustrated in FIG. 8, a resist remover is sprayed to remove the resists 150a and 150b. With this step, the process of forming the signal lines 20a-20c on the reverse surface of the sheet 118a and the process of forming the signal lines 20d-20f on the obverse surface of the sheet 118b end. The process illustrated by FIGS. 5-8 for preparing signal lines will hereinafter be referred to as a signal line preparing process.

Next, as illustrated in FIG. 9, the sheets 118a, 119 and 118b are stacked in this order from the upper side to the lower side. In other words, the sheets 118a, 119 and 118b are stacked such that the sheet 119 is sandwiched between the sheets 118a and 118b in the up-down direction. More specifically, the sheet 119 is placed on the obverse surface of the sheet 118b, on which the signal lines 20d-20f are formed, and the sheet 118a, on which the signal lines 20a-20c are formed, is placed on the obverse surface of the sheet 119. In this regard, the sheets 118a, 119 and 118b are stacked such that the signal lines 20a-20c overlap the signal lines 20d-20f, respectively, in the up-down direction and that the sheet 119 is sandwiched between the signal lines 20a-20c and the signal lines 20d-20f. Thus, the sheet 119 is placed so as to contact with the area between the signal lines 20a and 20b, the area between the signal lines 20b and 20c, the area between the signal lines 20d and 20e, and the area between the signal lines 20e and 20f. In FIG. 9, however, because the sheets 118a, 119 and 118b are illustrated at various intervals, the sheet 119 is illustrated as if the sheet 119 was not in contact with these areas. Also, the sheet 119 is placed so as to be sandwiched between the signal lines 20a and 20d, between the signal lines 20b and 20e and between the signal lines 20c and 20f.

Next, the stack of the sheets 118a, 119 and 118b is heated and pressed from above and underneath, and thus, the sheets 118a, 119 and 118b are joined together.

Now, phenomena occurring on the sheets 118a, 118b and 119 during the heating/pressing treatment are described. The sheets 118a and 119 soften by heat. The softening sheet 118a comes into the area between the signal lines 20a and 20b and the area between the signal lines 20b and 20c from above by pressure. Meanwhile, the softening sheet 119 comes into the area between the signal lines 20a and 20b and the area between the signal lines 20b and 20c from underneath by pressure.

The sheets 118b and 119 soften by heat. The softening sheet 118b comes into the area between the signal lines 20d and 20e and the area between the signal lines 20e and 20f from underneath by pressure. Meanwhile, the softening sheet 119 comes into the area between the signal lines 20d and 20e and the area between the signal lines 20e and 20f from above by pressure. Thus, in a cross section perpendicular or substantially perpendicular to the front-rear direction, the sheet 119 occupies at least a portion of the areas among the signal lines 20a-20f.

Further, the portion of the sheet 118a protruding rightward from the sheet 119 and the portion of the sheet 118b protruding rightward from the sheet 119 are joined together. The portion of the sheet 118a protruding leftward from the sheet 119 and the portion of the sheet 118b protruding leftward from the sheet 119 are joined together. As a result, in a cross section perpendicular or substantially perpendicular to the front-rear direction, the sheets 118a and 118b define a loop enclosing the signal lines 20a-20f and the sheet 119. Through the process above, a mother body 112 is produced.

Finally, the mother body 112 is cut by a dicer or the like. In this way, high-frequency signal transmission lines 10 are produced.

According to the present preferred embodiment, the high-frequency signal transmission line 10 having a function to eliminate common mode noise is able to be made smaller for the reason as described below. FIG. 10A is a sectional view of a high-frequency signal transmission line 210 according to a comparative example.

The high-frequency signal transmission line 210 illustrated in FIG. 10A differs from the high-frequency signal transmission line 10 in that the base layers 218a, 218b and 219 are made of the same material having a relatively high relative permeability.

In the high-frequency signal transmission line 210, when common mode signals flow from the front side to the rear side along the signal lines 220a and 220b, magnetic fluxes ϕ11 and ϕ12 circling clockwise around the signal lines 220a and 220b respectively are generated. The whole body 212 of the high-frequency signal transmission line 210 has a uniform or substantially uniform relative permeability. Therefore, the magnetic fluxes ϕ11 and ϕ12 take short routes and accordingly circle around the signal lines 220a and 220b, respectively. Accordingly, the magnetic flux ϕ11 and the magnetic flux ϕ12 are not strengthened by each other, and impedance to the common mode signals is unlikely to be generated.

In the high-frequency signal transmission line 10, in a cross section perpendicular or substantially perpendicular to the front-rear direction, the base layer 19 having a relatively low relative permeability μ2 occupies a portion of the area A1 between the signal lines 20a and 20b. As a result, the magnetic fluxes ϕ1 and ϕ2 to circle around the signal lines 20a and 20b do not pass the area A1 between the signal lines 20a and 20b easily. Also, in the cross section perpendicular or substantially perpendicular to the front-rear direction, the base layers 18a and 18b having a relatively high relative permeability μ1 define a loop enclosing the signal lines 20a-20f and the base layer 19. Therefore, the magnetic fluxes ϕ1 and ϕ2 circle around the signal lines 20a-20f and the base layer 19. That is, the magnetic flux ϕ1 and the magnetic flux ϕ2 take the same route. Therefore, the magnetic fluxes ϕ1 and ϕ2 are strengthened by each other, and impedance to the common mode signals is generated. Consequently, the common mode signals are converted into heat or reflected, and thus, the common mode signals are prevented from being transmitted outward. Thus, in the high-frequency signal transmission line 10, not due to a ferrite core provided outside but due to the base layer 19, which has a relatively low relative permeability μ2, provided in the body 12, common mode signals are eliminated. In this way, the high-frequency signal transmission line 10 having a function to eliminate common mode signals is made smaller.

The base layer 19 contacts with the signal line 20a and the signal line 20b. Therefore, the base layer 19 extends from the left end to the right end of the area A1, which results in more effective prevention of passing of the magnetic fluxes ϕ1 and ϕ2 through the area A1.

The relation between the signal lines 20a and 20b has been described as an example. The above-described relation is applied to any two adjacent ones of the signal lines 20a-20f.

The base layer 18a having a relatively high relative permeability μ1 contacts with the signal lines 20a-20c, and the base layer 18b having a relatively high relative permeability μ1 contacts with the signal lines 20d-20f. As a result, the magnetic fluxes generated by common mode signals flowing along the signal lines 20a-20f pass near the signal lines 20a-20f, and the routes of the magnetic fluxes are short. Accordingly, the magnetic fluxes generated from the signal lines 20a-20f are greatly strengthened by each other, and great impedance to the common mode signals is generated.

By the manufacturing method of the high-frequency signal transmission line 10, a small high-frequency signal transmission line 10 having a function to eliminate common mode signals is able to be produced easily. Specifically, the base layer 19 is made of a material containing thermoplastic resin. Accordingly, during the thermocompression bonding process to form the body 12, the base layer 19 comes into the area between the signal lines 20a and 20b, the area between the signal lines 20b and 20c, the area between the signal lines 20d and 20e, and the area between the signal lines 20e and 20f. Therefore, it is not necessary to carry out a process of applying a material of the base layer 19 or the like to provide the base layer 19 in these areas. Hence, the high-frequency signal transmission line 10 is produced easily.

Since the base layers 18a, 18b and 19 contain the same thermoplastic resin, the base layers 18a, 18b and 19 can be joined together firmly by thermocompression bonding, and delamination of the body 12 is prevented.

First Modification

A manufacturing method according to a first modification for manufacturing the high-frequency signal transmission line 10 will hereinafter be described with reference to the drawings. FIG. 10B is a sectional view illustrating a step of the manufacturing method according to the first modification.

The high-frequency signal transmission line 10 produced by the manufacturing method according to the first modification has a cross-section structure as illustrated in FIG. 3A, and a description thereof is omitted. The manufacturing method according to the first modification differs from the manufacturing method according to the above-described preferred embodiment in the positions where the signal lines 20a-20f are formed.

As illustrated in FIG. 10B, the signal lines 20a-20c are formed on the obverse surface of the sheet 119, and the signal lines 20d-20f are formed on the reverse surface of the sheet 119. The process for forming the signal lines 20a-20f on the both surfaces of the sheet 119 is substantially the same as the process for forming the signal lines 20a-20c on the reverse surface of the sheet 118a and the process for forming the signal lines 20d-20f on the obverse surface of the sheet 118b, and a description thereof is omitted. The formation of the signal lines 20a-20c and the formation of the signal lines 20d-20f may be carried out at the same time or at different times.

Next, as illustrated in FIG. 10B, the sheets 118a, 119 and 118b are stacked in this order from the upper side to the lower side. That is, the sheets 118a, 119 and 118b are stacked such that the sheet 119 is sandwiched between the sheets 118a and 118b in the up-down direction. The stack of the sheets 118a, 119 and 118b is heated and pressed from above and underneath, and thus, the sheets 118a, 119 and 118b are joined together. The phenomena occurring on the sheets 118a, 119 and 118b during the heating/pressing treatment are the same as those occurring during the heating/pressing treatment by the manufacturing method according to the above-described preferred embodiment, and descriptions thereof are omitted. Through the process above, a mother body 122 is produced.

Finally, the mother body 112 is cut by a dicer or the like. In this way, high-frequency signal transmission lines 10 are produced.

The manufacturing method of the high-frequency signal transmission line 10 according to the first modification brings out the same effects as the manufacturing method according to the above-described preferred embodiment.

In the manufacturing method according to the first modification, the signal lines 20a-20c are formed on the obverse surface of the sheet 119, and the signal lines 20d-20f are formed on the reverse surface of the sheet 119. Therefore, misalignment between the signal lines 20a-20c and the signal lines 20d-20f due to an error in stacking the sheets 118a, 119 and 118b is prevented.

Second Modification

A manufacturing method according to a second modification for manufacturing the high-frequency signal transmission line 10 will hereinafter be described with reference to the drawings. FIG. 11A is a sectional view illustrating a step of the manufacturing method according to the second modification.

The high-frequency signal transmission line 10 produced by the manufacturing method according to the second modification has a cross-section structure as illustrated in FIG. 3A, and a description thereof is omitted. The manufacturing method according to the second modification differs from the manufacturing method according to the above-described preferred embodiment in the positions where the signal lines 20a-20f are formed.

As illustrated in FIG. 11A, the signal lines 20a-20c are formed on the obverse surface of the sheet 119, and the signal lines 20d-20f are formed on the obverse surface of the sheet 118b. The process for forming the signal lines 20a-20c on the obverse surface of the sheet 119 and the process for forming the signal lines 20d-20f on the obverse surface of the sheet 118b are substantially the same as the process for forming the signal lines 20a-20c on the reverse surface of the sheet 118a and the process for forming the signal lines 20d-20f on the obverse surface of the sheet 118b, and descriptions of the processes are omitted.

Next, as illustrated in FIG. 11A, the sheets 118a, 119 and 118b are stacked in this order from the upper side to the lower side. Specifically, the sheet 119 with the signal lines 20a-20c formed on its obverse surface is placed on the obverse surface of the sheet 118b on which the signal lines 20d-29f are formed, and the sheet 118a is placed on the obverse surface of the sheet 119. The stack of the sheets 118a, 119 and 118b is heated and pressed from above and underneath, and thus, the sheets 118a, 119 and 118b are joined together. The phenomena occurring on the sheets 118a, 119 and 118b during the heating/pressing treatment are the same as those occurring during the heating/pressing treatment in the manufacturing method according to the preferred embodiment, and descriptions thereof are omitted. Through the process above, a mother body 122 is produced.

Finally, the mother body 112 is cut by a dicer or the like. In this way, high-frequency signal transmission lines 10 are produced.

The manufacturing method of the high-frequency signal transmission line 10 according to the second modification brings out the same effects as the manufacturing method according to the above-described preferred embodiment.

Third Modification

A high-frequency signal transmission line 10a according to a third modification will hereinafter be described with reference to the drawings. FIG. 11B is a sectional view of the high-frequency signal transmission line 10a. FIG. 11C is an exploded view of the high-frequency signal transmission line 10a.

The high-frequency signal transmission line 10a differs from the high-frequency signal transmission line 10 in that the body 12 includes base layers 32a, 30a, 19, 30b and 32b stacked on one another. In the following, the high-frequency signal transmission line 10a will be described focusing on the difference.

The body 12 includes the base layers 32a, 30a, 19, 30b and 32b stacked in this order from the upper side to the lower side. As is the case with the base layers 18a and 18b, the base layers 32a and 32b are made of a material obtained by mixing thermoplastic resin with a magnetic powder, and the base layers 32a and 32b have a relatively high relative permeability $\mu 1$. The base layers 30a and 30b are ceramic layers made of a magnetic material (for example, Ni—Cu—Zi-based ferrite), and the base layers 30a and 30b have a relatively high relative permeability $\mu 3$. The relative permeability $\mu 3$ may be higher or lower than the relative permeability $\mu 1$ as long as the relative permeability $\mu 3$ is higher than the relative permeability $\mu 2$. However, since the base layers 30a and 30b are ceramic layers, the relative permeability $\mu 3$ is usually higher than the relative permeability $\mu 1$. Thus, the base layers 30a and 30b are made of a material different from thermoplastic resin.

As illustrated in FIG. 11C, the signal lines 20a-20c are formed on the reverse surface of the base layer 30a. The signal lines 20d-20f are formed on the obverse surface of the base layer 30b. As a result, the signal lines 20a-20c are provided between the base layer 30a and the base layer 19, and the signal lines 20d-20f are provided between the base layer 19 and the base layer 30b.

As is the case with the high-frequency signal transmission line 10, in the high-frequency signal transmission line 10a having the structure above, in a cross section perpendicular or substantially perpendicular to the front-rear direction, the base layer 19 occupies a portion of the area between the signal lines 20a and 20b, a portion of the area between the signal lines 20b and 20c, a portion of the area between the signal lines 20d and 20e, and a portion of the area between the signal lines 20e and 20f.

As is the case with the high-frequency signal transmission line 10, in the high-frequency signal transmission line 10a having the structure above, in the cross section perpendicular or substantially perpendicular to the front-rear direction, the base layer 19 occupies the area between the signal lines 20a and 20d, the area between the signal lines 20b and 20e, and the area between the signal lines 20c and 20f.

The high-frequency signal transmission line 10a having the structure above brings out the same effects as the high-frequency signal transmission line 10.

The base layers 32a and 32b may be made of a metal, for example. In this case, the risk of noise radiation from the high-frequency signal transmission line 10a and the risk of noise penetration into the high-frequency signal transmission line 10a is reduced.

Fourth Modification

A high-frequency signal transmission line 10b according to a fourth modification will hereinafter be described with reference to the drawings. FIG. 12 is a sectional view of the high-frequency signal transmission line 10b. FIG. 13 is an exploded view of the high-frequency signal transmission line 10b.

The high-frequency signal transmission line 10b differs from the high-frequency signal transmission line 10 in the following two points. The first point is that the signal lines 20d-20f are not provided in the high-frequency signal transmission line 10b. The second point is that in a cross section of the high-frequency signal transmission line 10b cut perpendicular or substantially perpendicularly to the front-rear direction, the base layer 19 occupies only the area between the signal lines 20a and 20b and the area between the signal lines 20b and 20c.

The high-frequency signal transmission line 10b having the structure above brings out the same effects as the high-frequency signal transmission line 10.

In the high-frequency signal transmission line 10b, the base layer 19 lies neither above nor underneath the signal lines 20a-20c. Therefore, the high-frequency signal transmission line 10b is able to be made smaller.

In the high-frequency signal transmission line 10b, the base layer 19 lies neither above nor underneath the signal lines 20a-20c. Therefore, magnetic fluxes can pass immediately above and immediately underneath the signal lines 20a-20c, and the routes of the magnetic fluxes are shorter. Consequently, the magnetic fluxes generated from the signal lines 20a-20c are strengthened more by each other, and thus, greater impedance to common mode signals is generated.

In the high-frequency signal transmission line 10b, the base layer 19 may be formed of a sheet of thermoplastic resin or alternatively may be formed of insulating paste applied to the obverse surface of the base layer 18b.

Fifth Modification

Figure 14:
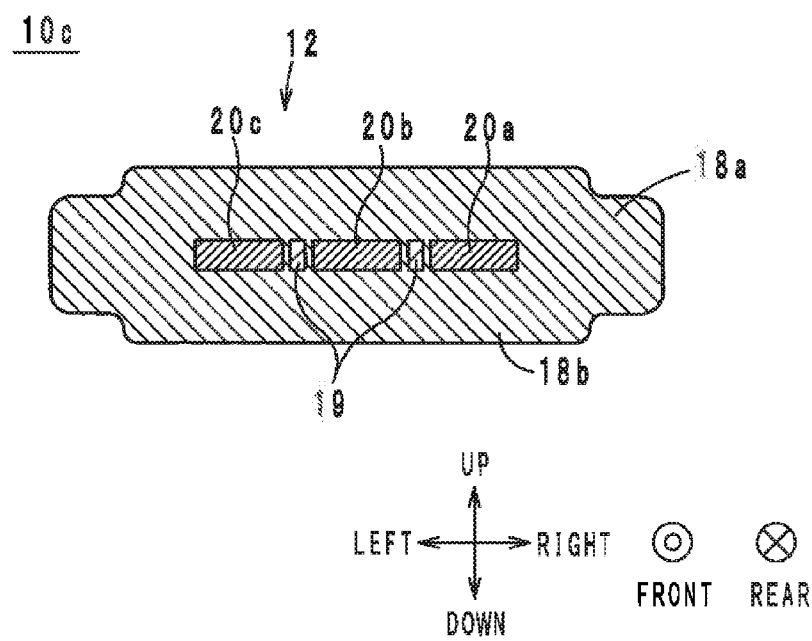
FIG. 14 is a sectional view of a high-frequency signal transmission line 10c.

A high-frequency signal transmission line 10c according to a fifth modification will hereinafter be described with reference to the drawings. FIG. 14 is a sectional view of the high-frequency signal transmission line 10c.

The high-frequency signal transmission line 10c differs from the high-frequency signal transmission line 10b in that the base layer 19 does not contact with the signal lines 20a-20c. More specifically, there are gaps between the respective signal lines 20a-20c and the base layer 19. The gaps are filled with the base layers 18a and 18b.

The high-frequency signal transmission line 10c having the structure above brings out the same effects as the high-frequency signal transmission line 10b.

Sixth Modification

Figure 15:
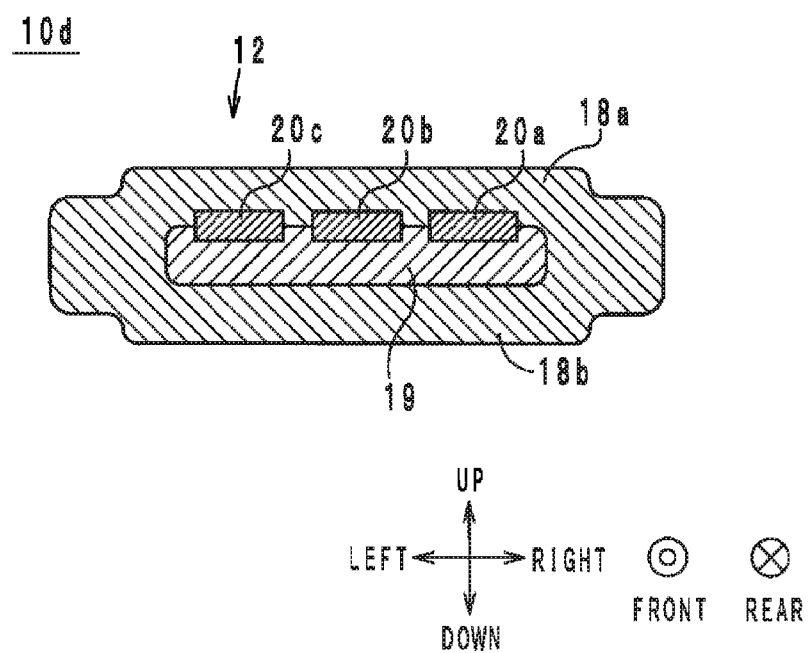
FIG. 15 is a sectional view of a high-frequency signal transmission line 10d.

A high-frequency signal transmission line 10d according to a sixth modification will hereinafter be described with reference to the drawings. FIG. 15 is a sectional view of the high-frequency signal transmission line 10d. FIG. 16 is an exploded view of the high-frequency signal transmission line 10d indicating a first example of a manufacturing method thereof. FIG. 17 is an exploded view of the high-frequency signal transmission line 10d indicating a second example of a manufacturing method thereof.

The high-frequency signal transmission line 10d differs from the high-frequency signal transmission line 10 in that the signal lines 20d-20f are not provided.

The signal lines 20a-20c may be formed on the reverse surface of the base layer 18a as illustrated in FIG. 16 or alternatively may be formed on the obverse surface of the base layer 19 as illustrated in FIG. 17.

The high-frequency signal transmission line 10d brings out the same effects as the high-frequency signal transmission line 10.

Seventh Modification

Figure 18:
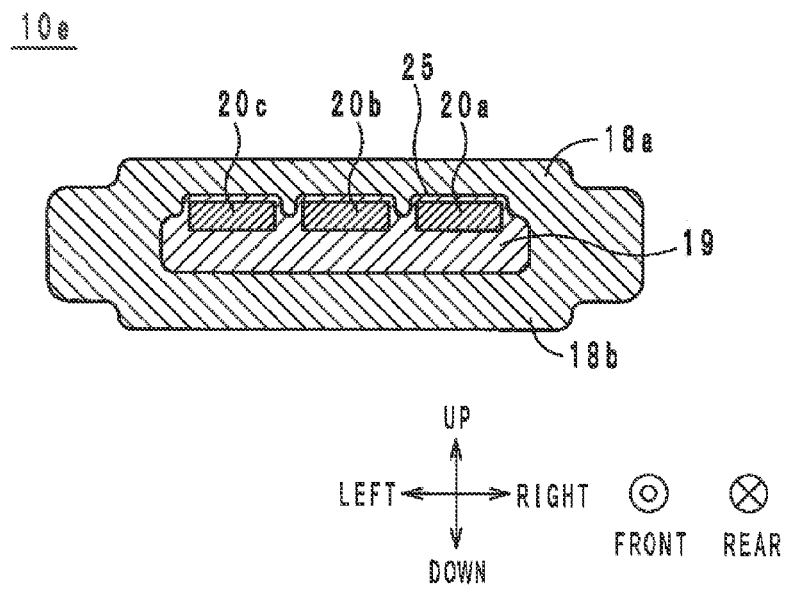
FIG. 18 is a sectional view of a high-frequency signal transmission line 10e.
Figure 19:
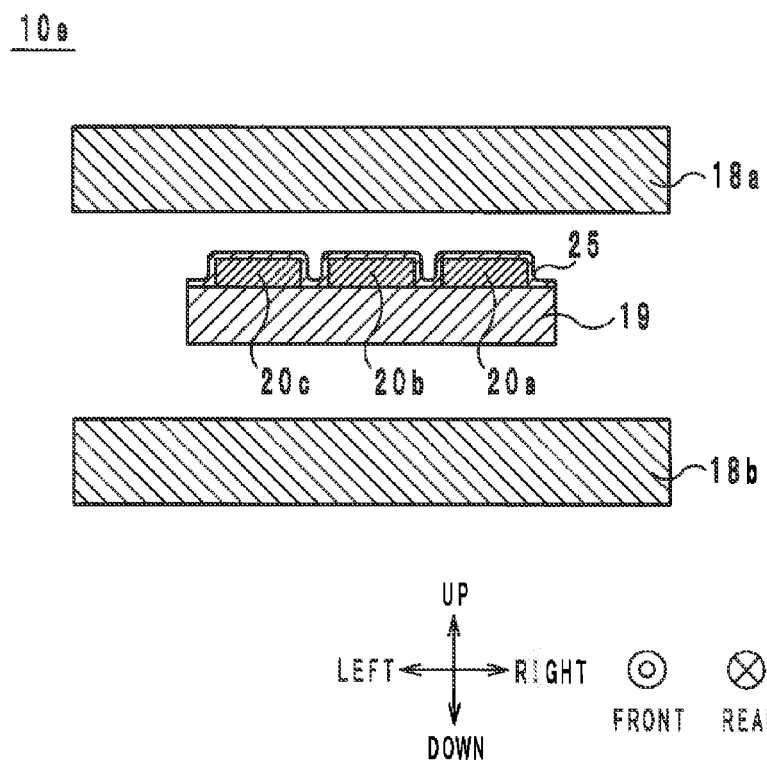
FIG. 19 is an exploded view of the high-frequency signal transmission line 10e.

A high-frequency signal transmission line 10e according to a seventh modification will hereinafter be described with reference to the drawings. FIG. 18 is a sectional view of the high-frequency signal transmission line 10e. FIG. 19 is an exploded view of the high-frequency signal transmission line 10e.

The high-frequency signal transmission line 10e differs from the high-frequency signal transmission line 10d in the following two points. The first point is that the base layer 19 is made of not thermoplastic resin but thermosetting resin, such as epoxy or the like. The second point is that a base layer 25 is provided so as to cover the obverse surface of the base layer 19 and the signal lines 20a-20c.

The base layer 19 made of thermosetting resin is unlikely to come into the area between the signal lines 20a and 20b and the area between the signal lines 20b and 20c during the thermocompression bonding process to form the body 12. Therefore, the base layer 25, which has a relatively low relative permeability µ2, is further provided in the body 12 of the high-frequency signal transmission line 10e. The base layer 25 covers the obverse surface 19 and the signal lines 20a-20c. Accordingly, the base layer 25 lies in the area between the signal lines 20a and 20b and in the area between the signal lines 20b and 20c. The base layer 25 is formed by application of thermosetting resin such as epoxy or the like.

The high-frequency signal transmission line 10e having the structure above has the same effects as the high-frequency signal transmission line 10d.

Eighth Modification

A high-frequency signal transmission line 10f according to an eighth modification will hereinafter be described with reference to the drawings. FIG. 20 is a sectional view of the high-frequency signal transmission line 10f.

The high-frequency signal transmission line 10f differs from the high-frequency signal transmission line 10a in that the signal lines 20a-20d are arranged in a zigzag pattern. More specifically, the signal lines 20a and 20c are located on the reverse surface of the base layer 19, and the signal lines 20b and 20d are located on the obverse surface of the base layer 19. Thus, the position in the up-down direction where the signal lines 20a and 20c are located is different from the position in the up-down direction where the signal lines 20a and 20c are located. The signal lines 20a-20d are arranged in this order from right to left. When viewed from above, adjacent ones of the signal lines 20a-20d do not overlap each other.

The high-frequency signal transmission line 10f having the structure above brings out the same effects as the high-frequency signal transmission line 10.

According to the eighth modification, the dimension in the right-left direction (width) of the high-frequency signal transmission line 10f is reduced. In order to reduce the width of a high-frequency signal transmission line, the gap between widthwise adjacent signal lines (adjacent signal lines in the right-left direction) may be possibly reduced. However, if the gap between the adjacent signal lines is reduced too much, thus causing the adjacent signal lines to become too close, the insulation performance between the signal lines cannot be maintained.

In order to avoid this problem, in the high-frequency signal transmission line 10f, the signal lines 20a-20d are arranged in a zigzag pattern. In this structure, it is possible to reduce the widthwise gap (the gap in the right-left direction) between widthwise adjacent ones of the signal lines 20a-20d without causing the widthwise adjacent signal lines to become too close to each other. Consequently, the high-frequency signal transmission line 10f has a reduced width (a reduced dimension in the right-left direction).

In the high-frequency signal transmission line 10f, the gap between the widthwise adjacent signal lines 20a and 20b, for example, is reduced. In this case, magnetic fluxes generated around the signal line 20a and magnetic fluxes generated around the signal line 20b are unlikely to pass through between the signal lines 20a and 20b. Accordingly, the magnetic fluxes generated around the signal lines 20a and 20b circle around the signal lines 20a-20d and the base layer 19. This applies to the signal lines 20b and 20c, and the signal lines 20c and 20d as well. Consequently, in the high-frequency signal transmission line 10f, common mode signals are eliminated more effectively.

In the high-frequency signal transmission line 10f, the signal lines 20a and 20c are located on the reverse surface of the base layer 19, and the signal lines 20b and 20d are located on the obverse surface of the base layer 19. However, the signal lines 20a-20d may be located inside the base layer 19.

In the high-frequency signal transmission line 10f, widthwise adjacent ones of the signal lines 20a-20d do not overlap each other. However, the widthwise adjacent signal lines may overlap each other. The number of signal lines provided in the high-frequency signal transmission line 10f is not limited to four and may be any number equal to or more than three.

Other Preferred Embodiments

High-frequency signal transmission lines and manufacturing methods according to the present invention are not limited to the high-frequency signal transmission lines 10 and 10a-10f and the manufacturing methods according to the preferred embodiments and the modifications described above. Various other changes and modifications are possible.

The base layer 19 does not need to occupy only a portion of the area between the signal lines 20a and 20b and may occupy the entire area between the signal lines 20a and 20b.

The body 12 does not need to be flexible.

The base layer 19 does not need to be made of thermoplastic resin mixed with no magnetic powder and may be made of thermoplastic resin mixed with a magnetic powder. However, it is preferred that the relative permeability $\mu 2$ of the base layer 19 is lower than the relative permeability $\mu 1$ of the base layers 18a and 18b.

The base layers 18a and 18b do not need to be made of thermoplastic resin and may be made of a material containing thermoplastic resin.

The structures of the high-frequency signal transmission lines 10 and 10a-10f may be combined arbitrarily.

The base layers 30a and 30b do not need to be ceramic layers and may be base layers made of a mixture of ceramic and non-thermoplastic resin, such as epoxy resin, rubber or the like. In this case, the high-frequency signal transmission line 10a will be more flexible and easier to handle.

Preferred embodiments of the present invention are useful for high-frequency signal transmission lines and manufacturing methods thereof. Especially, preferred embodiments of the present invention achieve an advantageous effect to reduce the size of a high-frequency signal transmission line that eliminates common mode noise.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal transmission line comprising:
   a body including a plurality of first base layers and a second base layer stacked in a stacking direction, the plurality of first base layers having a first relative permeability, the second base layer having a second relative permeability lower than the first relative permeability;
   a first signal line provided at the body; and
   a second signal line provided at the body and extending along the first signal line; wherein
   in a cross section perpendicular or substantially perpendicular to a first direction in which the first signal line extends, the second base layer occupies at least a portion of an area between the first signal line and the second signal line; and
   in the cross section perpendicular or substantially perpendicular to the first direction, the plurality of first base layers define a loop enclosing the first signal line, the second signal line and the second base layer.

2. The high-frequency signal transmission line according to claim 1, wherein the second base layer contacts with the first signal line and the second signal line.

3. The high-frequency signal transmission line according to claim 1, wherein at least one of the first base layers contacts with the first signal line and the second signal line.

4. The high-frequency signal transmission line according to claim 1, wherein
   in the cross section perpendicular or substantially perpendicular to the first direction, the first signal line and the second signal line are arranged in the stacking direction;
   the second base layer is sandwiched between two of the first base layers;

the first signal line is located between one of the two first base layers and the second base layer; and the second signal line is located between the other of the two first base layers and the second base layer.

5. The high-frequency signal transmission line according to claim 1, wherein in the cross section perpendicular or substantially perpendicular to the first direction, the first signal line and the second signal line are arranged in a direction perpendicular or substantially perpendicular to the stacking direction;

the second base layer is sandwiched between two of the first base layers; and the first signal line and the second signal line are located between one of the two first base layers and the second base layer.

6. The high-frequency signal transmission line according to claim 1, further comprising a third signal line provided in the body and extending along the first signal line, wherein in the cross section perpendicular or substantially perpendicular to the first direction, the third signal line is located in a different position in a second direction perpendicular or substantially perpendicular to the first direction from the first signal line and the second signal line; and the first signal line, the third signal line and the second signal line are arranged in this order in a third direction perpendicular or substantially perpendicular to the first direction and the second direction.

7. The high-frequency signal transmission line according to claim 1, wherein the second base layer is made of a material containing thermoplastic resin.

8. The high-frequency signal transmission line according to claim 7, wherein the first base layers are made of a material that is a mixture of thermoplastic resin and a magnetic powder.

9. A method for manufacturing a high-frequency signal transmission line, the method comprising:

a first base layer preparing step of preparing a plurality of first base layers having a first relative permeability;

a second base layer preparing step of preparing a second base layer made of a material containing thermoplastic resin and having a second relative permeability lower than the first relative permeability;

a signal line preparing step of preparing a first signal line and a second signal line extending along the first signal line;

a stacking step of stacking the first base layers and the second base layer while placing the second base layer in an area between the first signal line and the second signal line or in contact with the area between the first signal line and the second signal line in a cross section perpendicular or substantially perpendicular to an extending direction of the first signal line such that the first signal line, the second signal line and the second layer are sandwiched between the first base layers; and a pressure bonding step of heating and pressing the stacked first and second base layers.

10. The method according to claim 9, wherein the first base layers are made of a material containing the same or substantially the same thermoplastic resin used as a material of the second base layer.

11. The method according to claim 10, wherein the first base layers are made of a material prepared by mixing the thermoplastic resin with a magnetic powder.

12. The method according to claim 9, wherein the second base layer contacts with the first signal line and the second signal line.

13. The method according to claim 9, wherein at least one of the first base layers contacts with the first signal line and the second signal line.

14. The method according to claim 9, wherein in the cross section perpendicular or substantially perpendicular to the first direction, the first signal line and the second signal line are arranged in the stacking direction;

the second base layer is sandwiched between two of the first base layers;

the first signal line is located between one of the two first base layers and the second base layer; and the second signal line is located between the other of the two first base layers and the second base layer.

15. The method according to claim 9, wherein in the cross section perpendicular or substantially perpendicular to the first direction, the first signal line and the second signal line are arranged in a direction perpendicular or substantially perpendicular to the stacking direction;

the second base layer is sandwiched between two of the first base layers; and the first signal line and the second signal line are located between one of the two first base layers and the second base layer.

16. The method according to claim 9, further comprising a third signal line forming step of forming a third signal line in the body and extending along the first signal line, wherein in the cross section perpendicular or substantially perpendicular to the first direction, the third signal line is located in a different position in a second direction perpendicular or substantially perpendicular to the first direction from the first signal line and the second signal line; and the first signal line, the third signal line and the second signal line are arranged in this order in a third direction perpendicular or substantially perpendicular to the first direction and the second direction.

* * * * *